(12) United States Patent  
Ortega Tañá et al.

(10) Patent No.: US 12,259,347 B2  
(45) Date of Patent: Mar. 25, 2025

(54) DEVICE AND METHOD FOR SENSING THE CONDUCTIVITY OF A FLUID

(71) Applicants: CONSEJO SUPERIOR DE INVESTIGACIONES CIENTÍFICAS, Madrid (ES); INSTITUCIÓ CATALANA DE RECERCA I ESTUDIS AVANÇATS, Barcelona (ES)

(72) Inventors: Laura Ortega Tañá, Cerdanyola del Vallès (ES); Anna Llorella Bustins, Cerdanyola del Vallès (ES); Juan Pablo Esquivel Bojorquez, Barcelona (ES); Neus Sabaté Vizcarra, Barcelona (ES)

(73) Assignees: CONSEJO SUPERIOR DE INVESTIGACIONES CIENTÍFICAS, Madrid (ES); INSTITUCIÓ CATALANA DE RECERCA I ESTUDIS AVANATS (ICREA), Barcelona (ES)

( * ) Notice: Subject to any disclaimer, the term of this patent is extended or adjusted under 35 U.S.C. 154(b) by 870 days.

(21) Appl. No.: 16/979,114

(22) PCT Filed: Mar. 11, 2019

(86) PCT No.: PCT/EP2019/056053  
§ 371 (c)(1),  
(2) Date: Sep. 8, 2020

(87) PCT Pub. No.: WO2019/175119  
PCT Pub. Date: Sep. 19, 2019

(65) Prior Publication Data  
US 2020/0400596 A1     Dec. 24, 2020

(30) Foreign Application Priority Data

Mar. 12, 2018   (EP) .................................... 18382158

(51) Int. Cl.  
*G01N 27/07* (2006.01)  
*G01R 31/389* (2019.01)  
(Continued)

(52) U.S. Cl.  
CPC .......... *G01N 27/07* (2013.01); *G01R 31/389* (2019.01); *H01M 6/32* (2013.01); *H01M 10/484* (2013.01)

(58) Field of Classification Search  
CPC ........ H01M 6/30; H01M 6/32; H01M 10/484; G01N 27/02; G01N 27/06; G01N 27/07; (Continued)

(56) References Cited

U.S. PATENT DOCUMENTS

2004/0245101 A1* 12/2004 Willner .................. H01M 8/16  
                                                                 204/403.01  
2010/0213057 A1* 8/2010 Feldman ............ G01N 27/3273  
                                                                 204/403.14  
(Continued)

FOREIGN PATENT DOCUMENTS

CN         102760893 A        10/2012  
JP         2004527769 A        9/2004  
(Continued)

OTHER PUBLICATIONS

Office Action in related Chinese patent application 201980031814.2 prepared by the State Intellectual Property Office of People's Republic of China dated May 26, 2023, official translation provided.  
(Continued)

*Primary Examiner* — Matthew W Van Oudenaren  
(74) *Attorney, Agent, or Firm* — Hassan Abbas Shakir; Shakir Law PLLC

(57) ABSTRACT

A device and a method for sensing the electrolytic conductivity of a fluid are disclosed. The device comprises a battery (1) having an oxidizing electrode (2) and a reducing elec-  
(Continued)

trode (3) connected by a hydrophilic and/or a porous material or an empty receptacle (4) providing a microfluidic cavity for a fluid (10), said battery (1) being activated upon the addition of said fluid (10) therein and providing electrical energy while the fluid (10) impregnates by capillarity said microfluidic cavity; and at least one instrument (5) connected to the battery (1). The instrument (5) has an equivalent impedance that makes the battery (1) work at a specific operating point allowing determining or discriminating among values of electrolytic conductivity of the fluid (10) and includes means for quantifying the electrolytic conductivity of the fluid (10), thereby inferring the conductivity of the fluid (10) from the performance of the battery (1).

12 Claims, 10 Drawing Sheets

(51) Int. Cl.
  *H01M 6/32* (2006.01)
  *H01M 10/48* (2006.01)

(58) Field of Classification Search
  CPC .... G01N 27/28; G01N 27/307; G01N 27/416; G01N 27/4166; G01R 31/389
  See application file for complete search history.

(56) References Cited

U.S. PATENT DOCUMENTS

| | | | |
|---|---|---|---|
| 2013/0057295 A1 | 3/2013 | Salgado | |
| 2014/0349211 A1 | 11/2014 | Wei | |
| 2016/0097739 A1* | 4/2016 | Pennathur | G01N 27/06 204/601 |
| 2016/0223490 A1* | 8/2016 | Astley | G01N 27/4075 |
| 2017/0018784 A1 | 1/2017 | Yun | |

FOREIGN PATENT DOCUMENTS

| | | | |
|---|---|---|---|
| JP | 2005501253 A | 1/2005 |
| JP | 2006064499 A | 3/2006 |
| JP | 2008512839 A | 4/2008 |
| JP | 200930271 A | 12/2009 |
| JP | 2012517075 A | 7/2012 |
| JP | 2014534288 A | 12/2014 |
| JP | 2016534368 A | 11/2016 |
| JP | 2018031740 A | 3/2018 |
| TW | 200830615 A | 7/2008 |
| WO | 2003034521 A1 | 4/2003 |
| WO | 2007059589 A | 5/2007 |

OTHER PUBLICATIONS

International Search Report by the International Searching Authority for PCT related patent application PCT/EP2019/056053 prepared by the European Patent Office and dated Apr. 17, 2019.
Written Opinion for related PCT patent application PCT/EP2019/056053 prepared by the European Patent Office and dated Apr. 17, 2019.
Supplementary Search in related Chinese patent application 201980031814.2 prepared by the State Intellectual Property Office of People's Republic of China dated Mar. 7, 2024 on Global Dossier, in English.
Japanese Search Document in related Japanese Patent Application No. 2020-549018 prepared by the Japanese Patent Office dated Oct. 26, 2022, in English.

* cited by examiner

DEVICE AND METHOD FOR SENSING THE CONDUCTIVITY OF A FLUID

TECHNICAL FIELD

The present invention is directed, in general, to the field of liquid-activated batteries such as paper-based batteries. In particular, the invention relates to a device and to a method for sensing/measuring the electrolytic conductivity of a fluid using a battery.

By electrolytic conductivity here it will be understood the ability of a fluid, liquid or sample to conduct electricity due to its ionic composition.

BACKGROUND OF THE INVENTION

An electrical conductivity meter (EC meter) measures the electrolytic conductivity in a solution. The common laboratory conductivity meters employ a potentiometric or amperometric method and four electrodes. An alternating current or voltage is applied to the outer pair of the electrodes. The potential or the current established between the inner pair is measured. In a simplified version, only two electrodes are used to apply the electrical load (alternate current or voltage) and read the output signal.

Industrial conductivity probes often employ an inductive method, which has the advantage that the fluid does not wet the electrical parts of the sensor. Here, two inductively-coupled coils are used. One is the driving coil producing a magnetic field and it is supplied with accurately-known voltage. The induced current is the output of the sensor.

In chemical or biochemical fields, Conductometry is a measurement of electrolytic conductivity that can be used to monitor a progress of a chemical or biochemical reaction. Conductometric biosensors have been developed to measure alterations in conductivity of liquid samples as a consequence of consumption or production of charged species in a reaction.

The most important advantages of the use of conductometric biosensors compared to amperometric or potentiometric sensors are [1]: these thin-film electrodes can be miniaturized and adapted to the actual large-scale production; they do not require of a reference electrode; they are not light sensitive; have low power consumption and requirements; and many compounds can be sensed on the basis of different reactions due to the change in charged species, and therefore, in the ionic composition of the solution.

These biosensors measure the ability of an analyte to conduct an electrical current between two noble-metal electrodes by the applying of a small sinusoidal AC signal by Electrochemical Impedance Spectroscopy (EIS) [2].

Traditionally, conductometric biosensors have consisted on two coplanar parallel electrodes, but with the use of techniques taken from the microelectronics industry and precious metals, many types of sensors have been developed ending with the best design, which consists on an array of interdigitated electrodes.

Based on the ionic composition modification phenomena due to the consumption or production of charged species in enzyme catalyze reactions or enzyme inhibition these conductometric sensors have been widely studied. One of the first approaches was to determine the urea concentration in solutions by a conductivity cell and bridge [3]. In this work, the urea concentration was determined by the change in conductivity of the solution because of the formation of ammonium carbonate in the urea hydrolysis by urease. Although the quantification of urea was performed from a range 0.1 μm to 2 mM at pH 7, it was observed that the presence of heavy metals in the solution, such as Ag or Hg, destructively interfered with the urease activity.

After, with the use of microfabricated interdigitated electrodes a multi-analyte conductance biosensor was developed in order to sense urea, L-asparagine and creatinine by the immobilization of their respective enzymes for hydrolysis [4]. Even no detectable interferences between the adjacent electrodes was not observed, due to the high ionic background of clinical samples and the small conductivity changes produced in the enzymatic reactions presented, the conductometric biosensor approach was limited.

One important limitation of the applicability of these sensors in portable and wearable devices is the large equipment associated with the mentioned systems that is needed, since to perform an impedance measurement the instrumentation required is complex and bulky in the most cases. This fact makes these types of sensors not suitable to be used in the manufacturing of disposable devices.

Another approach used in research is the protein immobilization of antibody-antigen on the electrode surface [5] and in the gap between electrodes [6], to sense changes in the conductance of the electrode as a result of a biorecognition event. With the same aim ISFET (Ion-Selective Field-Effect Transistors) and EnFET (Enzyme Field-Effect Transistors) were developed. The FET are transistors, which uses an electrical field to control the conductivity of a channel between two electrodes. Functionalizing the gate (the third electrode which connects the two previous mentioned) researchers have been developing different sensors such as pH-sensitive, penicillin, glucose or urea [7]-[10]. However, these devices require a stable and reliable reference electrode which in most of the cases prevents their application in real scenarios. Their limited selectivity is also a drawback.

Apart from that, liquid-activated batteries are devices that consist of at least two electroactive electrodes, at least one of them oxidizing (anode 2) and at least one of them reducing (cathode 3) connected by a hydrophilic and/or porous material (or a receptacle/cavity) 4 able to hold a fluid 10, as depicted in FIG. 1. The battery starts to function upon the addition of the fluid 1, as this fluid acts as the battery electrolyte. The liquid used to activate the battery operation is generally a water-based fluid. These batteries are primary batteries that cease to function when one of the electrodes is exhausted. Their limited operating time and simplicity in terms of structure and materials used makes them particularly suitable for short-term applications such as diagnostic or wearable devices.

These kinds of batteries have been disclosed in several patents or patent applications such as US-A1-20080038588, US-A1-20100203394, WO 2007059589, WO 2003034521, CN-A-102760893 and US-A1-2017018784.

Similar structures have been disclosed in previous patent applications with the aim of determining analyte concentrations in a liquid medium (US-A1-2004245101, US-A1-2010213057). These documents describe the use of the signal produced by a fuel cell to extract information about the concentration or presence of organic analytes that are oxidized or reduced in one of the electrodes. As the electrical current generated in the fuel cell is dependent on the amount of analyte present in the fluid, the device operates as a self-powered sensor. In these inventions, the electrodes have to include an electroactive enzyme able to oxidize and reduce the analyte to be detected. This means that the electrodes have to be able to interact with the analyte to be sensed by a redox reaction that oxidizes or reduces the analyte. Therefore, only species able to undergo such redox reactions can be detected.

In other inventions (US-A1-2014349211, US-A1-2016223490) the variation of a proton activated graphene-based battery can be related to the degree of humidity to which the graphene electrodes are exposed, and therefore the battery can be used as a humidity sensor.

The present invention proposes to use a battery to sense ionic conductivity by using the liquid to be sensed as battery electrolyte. Unlike US-A1-2004/245101 and US-A1-2010/213057, in the present invention the fluid to be sensed acts as an ionic electrolyte and not as a fuel. The main difference between prior art and the present invention relies on both the nature of the species to be detected and the nature of the device allowing to do so; determination of species in prior art require a fuel cell electrode in which these species are oxidized and reduced producing an electrical current according to the analyte concentration. In the present invention, the battery performance is sensitive only to the presence of analytes with ionic charge (ions or charged molecules) that determine the electrolytic conductivity of the fluid to be sensed. Electrodes are made of a material that oxidizes and reduces itself and are connected through the fluid to be analyzed, that acts as battery electrolyte. In this way, the concentration of charged species of the fluid impacts on the internal resistivity of the battery. This determines the oxidation and reduction rates of both electrodes, and therefore the overall battery performance.

Moreover, contrary to US-A1-2014349211 and US-A1-2016223490, in which a battery with graphene-based electrodes is used as a humidity sensor due to the change in internal resistance of the electrodes that is modulated by the existence of different proton concentrations, the present application does not relate to the change on electrode resistance but to the change in the electrolytic conductivity of the fluid that acts as electrolyte.

In the present invention, electrodes and connecting wires are maintained unaltered and constant so the battery performance, voltage and current, can be related directly to the ionic conductivity of the electrolyte, obtaining a conductivity sensor.

Therefore, none of the prior art takes advantage of the fact that the electrolytic conductivity of the fluid used to activate the battery can be sensed by measuring the effect of its influence on the battery performance.

Therefore, an object of present invention is to provide a fluid-activated battery that is used as a fluid conductivity sensor.

REFERENCES

[1] N. Jaffrezic-Renault and S. V Dzyadevych, "Conductometric Microbiosensors for Environmental Monitoring.," *Sensors (Basel).*, vol. 8, no. 4, pp. 2569-2588, April 2008.
[2] D. Grieshaber, R. MacKenzie, J. Vörös, and E. Reimhult, "Electrochemical Biosensors—Sensor Principles and Architectures.," *Sensors (Basel).*, vol. 8, no. 3, pp. 1400-1458, March 2008.
[3] W. Chin and W. Kroontje, "Conductivity Method for Determination of Urea," *Anal. Chem.*, vol. 33, no. 12, pp. 1757-1760, November 1961.
[4] D. C. Cullen, R. S. Sethi, and C. R. Lowe, "Multi-analyte miniature conductance biosensor," *Anal. Chim. Acta*, vol. 231, pp. 33-40, January 1990.
[5] R. Pei, Z. Cheng, E. Wang, and X. Yang, "Amplification of antigen-antibody interactions based on biotin labeled protein-streptavidin network complex using impedance spectroscopy," *Biosens. Bioelectron.*, vol. 16, no. 6, pp. 355-361, August 2001.
[6] E. Katz and I. Willner, "Probing Biomolecular Interactions at Conductive and Semiconductive Surfaces by Impedance Spectroscopy: Routes to Impedimetric Immunosensors, DNA-Sensors, and Enzyme Biosensors," *Electroanalysis*, vol. 15, no. 11, pp. 913-947, July 2003.
[7] Y.-L. Chin, J.-C. Chou, T.-P. Sun, W.-Y. Chung, and S.-K. Hsiung, "A novel pH sensitive ISFET with on chip temperature sensing using CMOS standard process."
[8] Z. X. Wang, S. Y. Li, L. C. Zhong, and G. X. Li, "Research and application of enzyme FET sensitive to penicillin.," *Chin. J. Biotechnol.*, vol. 6, no. 2, pp. 149-56, 1990.
[9] X.-L. Luo, J.-J. Xu, W. Zhao, and H.-Y. Chen, "A novel glucose ENFET based on the special reactivity of MnO2 nanoparticles," *Biosens. Bioelectron.*, vol. 19, no. 10, pp. 1295-1300, May 2004.
[10] C.-E. Lue, T.-C. Yu, C.-M. Yang, D. G. Pijanowska, and C.-S. Lai, "Optimization of Urea-EnFET Based on Ta2O5 Layer with Post Annealing," *Sensors*, vol. 11, no. 12, pp. 4562-4571, April 2011.
[11] M. Esmaeelpour, P. O. Watts, M. E. Boulton, J. Cai, and P. J. Murphy, "Tear film volume and protein analysis in full-term newborn infants.," *Cornea*, vol. 30, no. 4, pp. 400-4, April 2011.
[12] S. Emaminejad et al., "Autonomous sweat extraction and analysis applied to cystic fibrosis and glucose monitoring using a fully integrated wearable platform.," *Proc. Natl. Acad. Sci. U.S.A.*, vol. 114, no. 18, pp. 4625-4630, May 2017.
[13] H. R. Peck, D. M. Timko, J. D. Landmark, and D. F. Stickle, "A survey of apparent blood volumes and sample geometries among filter paper bloodspot samples submitted for lead screening," *Clin. Chim. Acta*, vol. 400, no. 1-2, pp. 103-106, February 2009.

DESCRIPTION OF THE INVENTION

To that end, present invention provides according to a first aspect a device for sensing the electrolytic conductivity of a fluid, comprising, as known in the field, a battery including an oxidizing electrode (i.e. an anode) and a reducing electrode (i.e. a cathode) separated at a distance and connected by a hydrophilic and/or a porous material or an empty receptacle providing a microfluidic cavity, i.e. an absorption zone/volume, for a fluid with a given conductivity; and an instrument connected to the battery configured to capture the electrical energy/power generated by the battery.

According to the proposed device, the battery is activated upon the addition of the fluid therein and provides electrical energy while the fluid impregnates by capillarity the microfluidic cavity. Besides, the instrument can be solely fed (in order to perform a task) by an amount of electrical energy provided by the battery or alternatively the instrument can be powered with an external power source and only complementary or in part by the battery.

Contrary to the known proposals, the instrument here proposed is designed such that its equivalent impedance makes the battery work (supplied power) at a specific operating point that allows determining or discriminating among values of electrolytic conductivity of the fluid. For example by coupling a given resistance or impedance value to the battery, the performance of the battery will depend on the internal resistance of the battery that at the same time has a dependence on the electrolytic conductivity of the fluid.

Therefore, for a given fluid with a given ionic content activating the battery, a specific instrument will be designed for sensing said ionic content. Moreover, the instrument includes means for quantifying the electrolytic conductivity of the fluid, thereby inferring the electrolytic conductivity of the fluid from the performance of the battery. That is, the proposed device uses the fluid-activated battery as a fluid conductivity sensor.

In particular, the cited instrument further comprises one or more electronic modules configured to perform power management functions, signal control and processing functions, data storage or telecommunication functions. Moreover, the instrument can further include a memory to store the result of the quantification. Even, the instrument can include a communication unit to transmit the result to an external device, and/or an audible and/or a visual indicator such as a buzzer, a screen, a display or an alarm to indicate said result.

In an embodiment, a power management unit of the instrument comprises, but is not limited to, the input impedance of the instrument and a signal-conditioning module. The input impedance can be static or dynamic, depending on the embodiment, so the battery works in Direct Current (DC) or Alternating Current (AC) for sensing the electrolytic conductivity of the fluid. The cited impedance can be a resistor, capacitor, inductor or a combination of them, among others.

The signal-conditioning module can adapt the signal provided by the battery protecting the rest of the electronic modules from damage caused by an overload condition or short circuit. Signal-conditioning module elements can include (but are not limited to) voltage converters and/or regulators, charge pumps, bias controllers, inverters, current regulators, among others.

The instrument can also include a signal processing module that processes the output signal of the battery and/or quantifies it in order to get an output value or response as a result of the electrolytic conductivity measurement. The treatment of the signal is performed by using filtering strategies such as low pass, high pass, band pass filters, or the combination of them among others. The signal processing module can also include a digitalization of the signal by using, for example, an analogue to digital converter or digital filters to process the signal. Moreover, the analysis of the signal can be performed by means of quantification or discrimination using transistors, microprocessors or integrated circuits, among others.

Data storage module comprises (but is not limited to) memories, including Random Access Memories or Read Only Memories, or elements to store any information provided by the battery such as capacitors or memristors, among others.

The cited instrument may also incorporate a communication module for data transmission, including but not limited to a visual, acoustic and/or mechanical emitter and/or data can be send to an external receiver by wired or wireless communication technologies. This communication technologies may include optical fibres or USB protocols for wired and radiofrequency, or infrared for wireless communication among others.

In a preferred embodiment, because of its simplicity, lower cost and lower space requirements, the electrolytic conductivity of the fluid is determined by a DC mode method such as polarization curves, cronopotentiometry, cronoamperometry, etc. In this case, the instrument can be configured to be solely powered by an amount of electrical energy provided by the battery (i.e. acting as a self-powered device) or can be solely powered by an external power source or by a combination of an amount of electrical energy provided by the battery and an external power source.

Alternatively, in another embodiment, the electrolytic conductivity can be determined by an AC mode method such as impedance spectroscopy or current interrupt measurements. In this case, the instrument can be configured to be solely powered by an amount of electrical energy provided by the battery.

According to an embodiment, the battery is a paper-based battery. The oxidizing electrode can be composed of any redox species, metal, alloy or polymer oxidizing material, for example of anthraquinone, viologen, TEMPO, calcium, iron, sodium, potassium, lithium, cadmium, copper, silver, magnesium, zinc, aluminum, among others. The reducing electrode can be composed of any redox species, metal, alloy or polymer reducing material, for example of an air-breathing cathode, iron, cobalt, nickel, benzoquinone, TEMPO, silver, silver chloride, silver oxide, silver peroxide, copper, copper chloride, manganese, mercury, platinum, gold or carbon-based, including but not limited to electrodes based on activated carbon, graphene, carbon nanotubes, carbon paste, glassy carbon paste, and glassy carbon, among others.

In the proposed device, the oxidizing electrode and the reducing electrode can be arranged side by side or face to face. Electrodes can be also arranged in an interdigitated configuration alternating anode and cathode electrode tracks. Moreover, the device can comprise several batteries connected in series to increase an output voltage or in parallel to increase an output current.

The fluid used in the device preferably is a water-based fluid, for example plain water or rain water, among other types of water, a beverage including juice or milk (among others), an ink or a biological fluid such as saliva, urine, blood, sperm, plasma, serum, mucus, tears, feces, sweat, among others. Alternatively, the fluid can be a non-aqueous liquid such as an ionic liquid.

Preferably, the cited instrument further comprises one or more electronic modules configured to perform power management functions, signal control and processing functions, data storage or telecommunication functions. Moreover, the instrument can further include a memory to store the result of the quantification. Even, the instrument can include a communication unit to transmit the result to an external device, and/or an audible and/or a visual indicator such as a buzzer, a screen, a display or an alarm to indicate said result.

According to an embodiment, the fluid used to impregnate the hydrophilic and/or porous material or empty receptacle is combined with a given amount of titrant, such that a specific ion or molecule concentration of the fluid can be determined by titration. Consequently, the proposed device can be used to measure the conductivity of a fluid that has been titrated in a beaker; alternatively, a known quantity of titrant can be stored in the battery and react with the fluid once this fluid is added to the battery. Titrant can be stored in solid form within the battery at different locations: on the electrodes, inside the hydrophilic and/or porous material or electrolyte cavity, in a dedicated extra hydrophilic porous membrane, etc. The reaction between a particular titrant and a particular ion/molecule present in the fluid will cause a conductivity change that will change, i.e. influence in a specific way the battery performance. This change will allow determining or estimating the amount of a specific ionic/molecular content present in the fluid.

According to another embodiment, an enzyme, bacteria or inorganic catalyst is added to the fluid before the fluid is introduced in the battery or alternatively the enzyme, bacteria or inorganic catalyst is stored in the hydrophilic and/or porous material or empty receptacle/cavity. The enzyme, bacteria or inorganic catalysts are configured to react chemically with a particular substance present in the fluid and cause a change in the electrolytic conductivity of the fluid.

In yet another embodiment, an ion selective membrane is included in the proposed device at an entry point of the fluid or in touch with the battery so the fluid introduced in the battery flows through or gets in contact with the membrane, before reaching the electrodes of the battery. In this way, depending on the ion selective membrane configuration used, a particular set of ions are trapped in the membrane and as a result, the fluid electrolytic conductivity is modified. This originates a change is the battery performance that allows to determine the ion nature and quantity present in the fluid sample.

According to a second aspect present invention also provides a method for sensing the electrolytic conductivity of a fluid. The method comprises adding a fluid with a given electrolytic conductivity to a battery comprising an oxidizing electrode and a reducing electrode separated at a distance and connected by a hydrophilic and/or a porous material or an empty receptacle providing a microfluidic cavity; the battery being activated upon the addition of the fluid; providing, by the battery, electrical energy/power while the fluid impregnates by capillarity the microfluidic cavity; and connecting at least one instrument to the battery. In the proposed method, the instrument is designed such that its equivalent impedance makes the battery work at a specific operating point that allows determining or discriminating among values of electrolytic conductivity of the fluid. Moreover, the instrument quantifies the electrolytic conductivity of the fluid from the energy supplied by the battery, such that the electrolytic conductivity of the fluid is inferred from the performance of the battery.

According to an embodiment, the method comprises adjusting or regulating a battery response by either adding one or more chemical species before or after the fluid is added to the battery to shift the electrolytic conductivity range in which the battery operates, adding salts before or after the fluid is added to the battery to increase the fluid electrolytic conductivity to achieve a selected sensitivity range, or adding an enzyme or metal catalyst to the fluid before its addition to the battery or to the hydrophilic and/or porous material or empty receptacle in order the enzyme or metal catalyst reacting with a particular substance present in the fluid causing a change in the electrolytic conductivity.

According to another embodiment, the method comprises adjusting a battery response by adding a given amount of titrant to the hydrophilic and/or porous material or an empty receptacle to determine a specific ion or molecule concentration of the fluid.

BRIEF DESCRIPTION OF THE DRAWINGS

The previous and other advantages and features will be more fully understood from the following detailed description of embodiments, with reference to the attached figures, which must be considered in an illustrative and non-limiting manner, in which.

DETAILED DESCRIPTION OF PREFERRED EMBODIMENTS

Present invention provides a device and a method to measure the electrolytic conductivity of a fluid 10 (or liquid) by using a battery.

Figure 1:
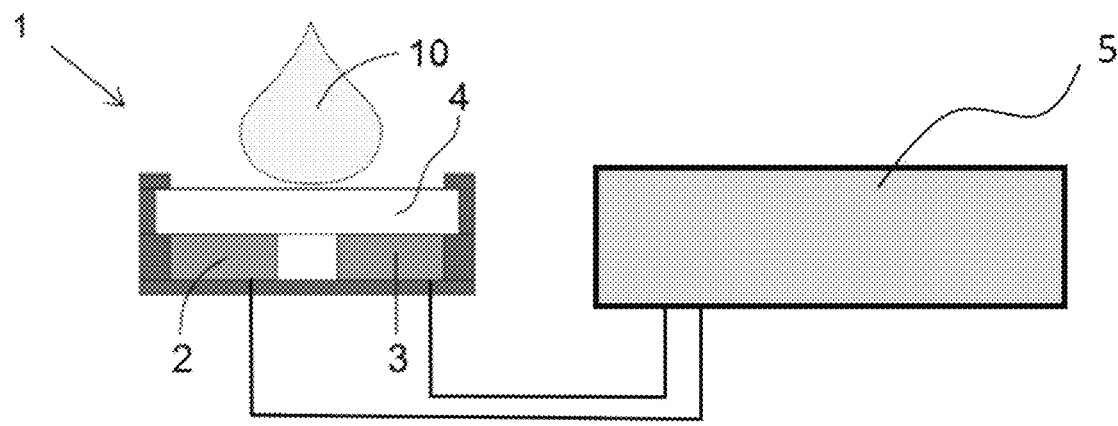
FIG. 1 illustrates an example of the proposed device including a liquid-activated battery and an instrument connected to the battery so designed to infer the electrolytic conductivity of the fluid/liquid activating the battery.

As can be seen in FIG. 1, the proposed device comprises a liquid (or fluid)-activated battery (it could include more than one) and an instrument 5 connected to the battery 1.

The voltage provided by the battery 1 depends firstly on the thermodynamic voltage of the electrochemical reactions involved in its electrodes 2, 3. However, in practice, this voltage decreases due to the overpotentials caused by the charge transfer polarization at the electrodes 2, 3, the voltage drop caused by the internal ohmic resistance and, at high current densities, the voltage drop due to concentration polarization losses.

When operated at moderate current densities (meaning that the battery 1 is not limited by concentration losses), the internal resistance of the battery 1 depends mainly on the electrical conductivity of the ohmic resistive elements (electrodes 2, 3 and connecting wires) and the ionic/electrolytic conductivity of the electrolyte (i.e. of the fluid 10). Hence, for a particular configuration of the battery materials and design, the battery internal resistance will be fully dependent on the electrolytic conductivity of the fluid 10 sample poured in its core.

The influence of the fluid electrolytic conductivity on the battery performance can be tested by well-known electrochemical characterization techniques such as potentiostatic or galvanostatic techniques (linear sweep voltammetry, chronoamperometry, chronopotentiometry, electrochemical impedance spectroscopy). AC methods or current-interrupt measurements, among others can also be used. Measurement of its generated voltage or current when connected to a fix or variable resistive load is also possible.

Compared to the state-of-the-art conductivity sensors, the proposed device presents two main advantages: (1) its response to conductivity can be characterized by DC mode as well of AC methods. DC methods allow simplifying the electronic module required to operate the instrument 5 and the power requirements; (2) if desired, the device response can be obtained without the need of an additional power source, so it can be operated as a self-powered sensor. This last feature makes the proposed device particularly suitable to sense electrolytic conductivity in portable and disposable applications, as it removes the need of requiring an additional power source.

In an embodiment, the cited instrument 5 connected to the battery 1 is an analytical device which is solely powered by the electrical energy provided by the battery 1 in order the instrument being able to quantify the electrolytic conductivity of the fluid sample 10. The instrument 5 can include a memory to store the result of this quantification and/or can include means to express it to a user. In this particular case, since the entire instrument 5 operates only with the power provided by the battery 1, without any external power sources, it can be called a self-powered device.

Moreover, the instrument 5 can include electronic modules (see FIG. 13 for a particular embodiment) performing functions such as power management, signal control and processing or telecommunications. Therefore, the instrument 5 could implement any electrochemical characterization instrumentation to evaluate the performance of the battery 1 and in this way quantify the concentration of the fluid 10 supplied. In a more preferred particular embodiment, the instrument 5 is designed so that its equivalent impedance makes the battery 1 work at a specific operating point that provides sufficient sensitivity to discriminate among values of electrolytic conductivity of the fluid 10. This last embodiment is advantageous since is more energy efficient, simpler and less expensive to implement.

The result of the electrolytic conductivity can be transmitted by the instrument 5 to an external device, for example a computer, a mobile phone, etc. by radio frequency or it can be expressed with a signal perceived by the user, such as an audible or visual indicator by means of a buzzer, screen, display, indicator, alarm, etc.

Thus, this type of self-powered device could be used to analyze and provide a rapid result of electrolytic conductivity of fluid samples in a variety of sectors such as physiological samples in the medical sector, water samples in environmental monitoring sector or beverages in the food sector.

The instrument 5 can be fabricated using different manufacturing techniques such as for example, printed electronics processes, as it offers the advantage of compatible component integration, low cost and disposability.

The response of the battery 1 can be adjusted by different means in order to enhance its performance to meet the requirements of a specific application. These battery power adjustments can lead to alterations in voltage and current outputs that improve the proposed device measurement range, as well as its sensitivity and specificity. Following, some possible ways to adjust the battery response are described.

In a first embodiment, the battery response is adjusted due to its configuration, materials and other geometrical parameters such as electrode reactive area, separation between electrodes and width, length and height of the hydrophilic and/or porous material or an empty receptacle. The electrode materials comprising the battery 1 determine the thermodynamic open circuit voltage of the battery 1. The anode electrode 2 can be composed of any redox species, metal, alloy or polymer oxidizing material, for example of anthraquinone, viologen, TEMPO, calcium, iron, sodium, potassium, lithium, cadmium, copper, silver, magnesium, zinc, aluminum, among others. The cathode electrode 3 can be composed of any redox species, metal, alloy or polymer reducing material, for example of an air-breathing cathode, iron, cobalt, nickel, benzoquinone, TEMPO, silver, silver oxide, silver peroxide, silver chloride, copper, copper chloride, manganese, mercury, platinum, gold or carbon-based, including but not limited to electrodes based on activated carbon, graphene, carbon nanotubes, carbon paste, glassy carbon paste, and glassy carbon, among others.

The material 4 can be any hydrophilic and/or porous material capable of absorbing or holding a fluid by capillary action. Porous materials include, but are not limited to, felts, paper-based materials for example glass fiber-based paper or celluloses—silica, gels, foams, cloth, sponges, ceramics, filters, meshes, wicks and polymers. Each material has a specific resistivity, porosity, pore size and fluid absorbance capacity (in the range of nanoliters to milliliters) that have an effect on the internal resistance of the battery 1. An empty receptacle/cavity (e.g. microchannel) to fill with the fluid sample 10 is also a possible alternative for putting in contact both electrodes 2, 3.

Figure 3:
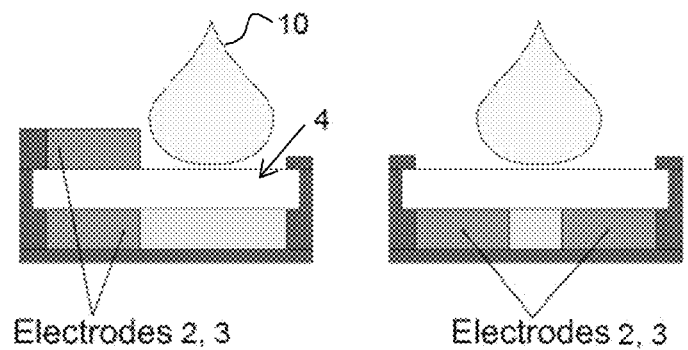
FIG. 3 schematically shows the two possible configurations of the electrodes in the battery.

The electrodes active area and shape determine the current provided by the battery 1. The electrode thickness has an effect in the duration of the battery 1 in operation and the internal resistance of the battery 1. The electrodes 2, 3 can be placed in a coplanar configuration (side by side) or in sandwich configuration (face to face) as shown in FIG. 3. The electrode configuration and the separation between electrodes also determine the internal resistance of the battery 1 and hence the response of the battery 1. In an alternative embodiment, in this case not illustrated in the figures, the electrodes 2, 3 are arranged in an interdigitated configuration.

Figure 4:
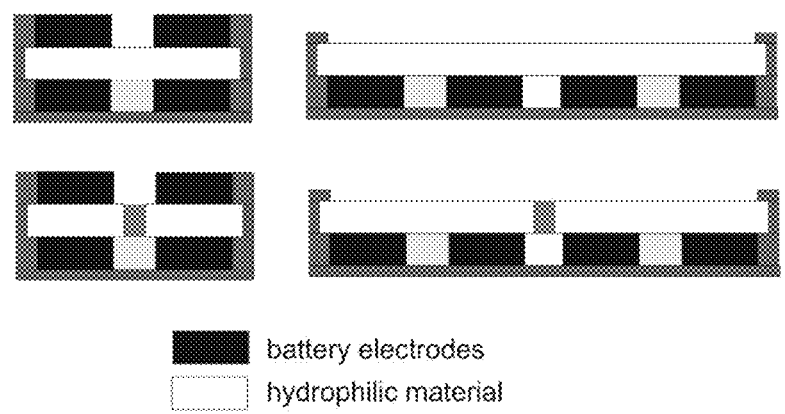
FIG. 4 shows battery stacks connected in parallel or in series.

Several batteries 1 can be connected in series to increase the output voltage or in parallel to increase the output current, as shown in FIG. 4.

In a second embodiment, the battery response is adjusted or further adjusted by the addition of chemical species. The properties of the fluid sample 10 to be measured can be altered by the addition of chemical species before or after the fluid sample 10 is introduced in the proposed device. In this way, the electrolytic conductivity range in which the battery 1 operates can be shifted or specific detection of an ion or molecule can be performed.

In a third embodiment, the battery response is adjusted by the addition of salts to increase the electrolytic conductivity of the fluid sample 10. The electrolytic conductivity of a fluid 10 depends on the charged species that are present in the liquid matrix. The battery 1 shows sensitivity within a range of fluid conductivities. This range can be tuned by adjusting different parameters as detailed before (electrode composition, geometry and separation, porosity and thickness of the hydrophilic electrolyte region, etc.). In addition to that, the addition of salts that increase the electrolytic conductivity of the fluid sample 10 in order to place it within the desired sensitive range can be effective when the fluid sample 10 to be measured has an electrolytic conductivity that yields below the sensitive range. The salts could be added before the fluid sample 10 is poured inside the battery 1 or they could be stored in solid form inside the hydrophilic and/or porous material or empty receptacle 4 of the battery 1 and dissolved when the fluid sample 10 is added.

In a fourth embodiment, the proposed device is used to perform in-situ conductometric titration. The proposed device in this case is used to determine the concentration of a specific ion or molecule in the fluid sample 10 used to activate the battery 1 by making use of the principle stablished in conductometric titration technique.

In this technique, a solution of known content and concentration is used to determine the concentration of a particular specie present in an unknown solution. Typically, the titrant (the know solution) is added in a controlled manner from a burette to a known quantity of the sample or analyte (the unknown solution) until the reaction is complete. Knowing the volume of titrant added allows the determination of the concentration of the unknown. Often, a colored indicator is used to usually signal the end of the reaction.

The principle of conductometric titration is based on the fact that during the titration, the generated reaction makes that one of the ions of the sample is replaced by another of different ionic conductivity with the result that conductivity of the solution varies during the course of titration.

Ions can also combine to form a stable molecule with no net electrical charge. The variation of the conductivity versus de quantity of titrant added to the sample provides valuable information about the a priori unknown concentration.

Figure 5A:
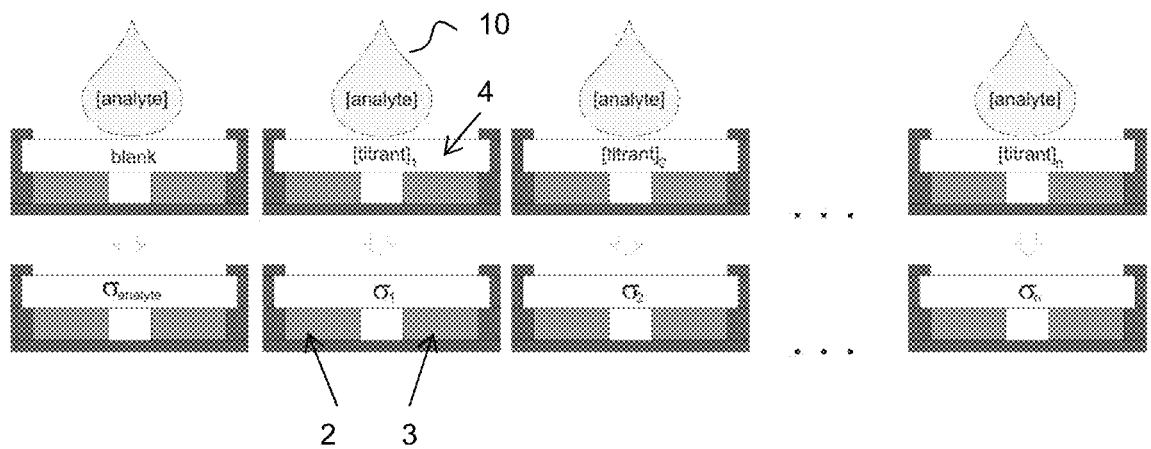
FIG. 5A illustrates an example of n batteries storing different quantities of titrant according to an embodiment of the present invention.
Figure 5B:
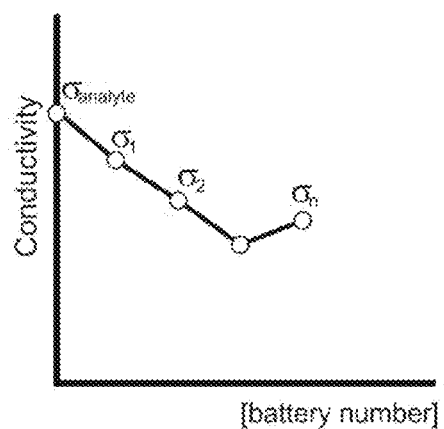
FIG. 5B shows the obtained values for each battery.

A particular example of this fourth embodiment is illustrated in FIG. 5. A matrix of identical n batteries 1 could be used to determine the equivalence point of a fluid sample 10 by storing different quantities of titrant inside the hydrophilic and/or porous material (e.g. in the form of a membrane) 4 (FIG. 5a). The same amount of analyte or fluid sample 10 added to activate the batteries 1 would mix with the different quantities of titrant and therefore, would yield different electrolytic conductivities. Extracting the resulting electrolytic conductivities from each battery 1 and depicting the obtained values in a graphic like the one of FIG. 5b would allow finding which of the batteries 1 approached best the equivalence point. Knowing the quantity of titrant stored in that particular battery 1 would allow determining the unknown concentration of the fluid sample 10. This approach could be also performed by fixing the amount of titrant for all the batteries 1 but tuning the volume of the membrane 4 so different sample volumes are stored in the batteries. Moreover, titrants could be of different natures so the battery matrix would allow detecting different analytes in the same sample.

In a fifth embodiment, the battery response is adjusted by the addition of catalysts. The electrolytic conductivity of the fluid sample 10 introduced in the battery 1 can be modified by the adding of an enzyme, bacteria or inorganic catalyst that reacts with a particular substance present in the fluid sample 10. The catalyst could be either mixed with the fluid sample 10 before its introduction to the battery 1 or could be stored in solid form within the battery 1 at different locations: immobilized on the electrodes 2, 3, inside the hydrophilic and/or porous material or electrolyte cavity 4 or in a dedicated porous membrane. The main sources causing a electrolytic conductivity change are generation or neutralization of ion groups, separation of different charges, ion migration, change in level of ion particles association or change in size of charged groups. This procedure allows determining the presence of a particular substance (that would be recognized specifically by the catalyst) in the fluid sample 10. Combination of this strategy in a battery matrix would allow quantifying the concentration of the particular substance.

Figure 6A:
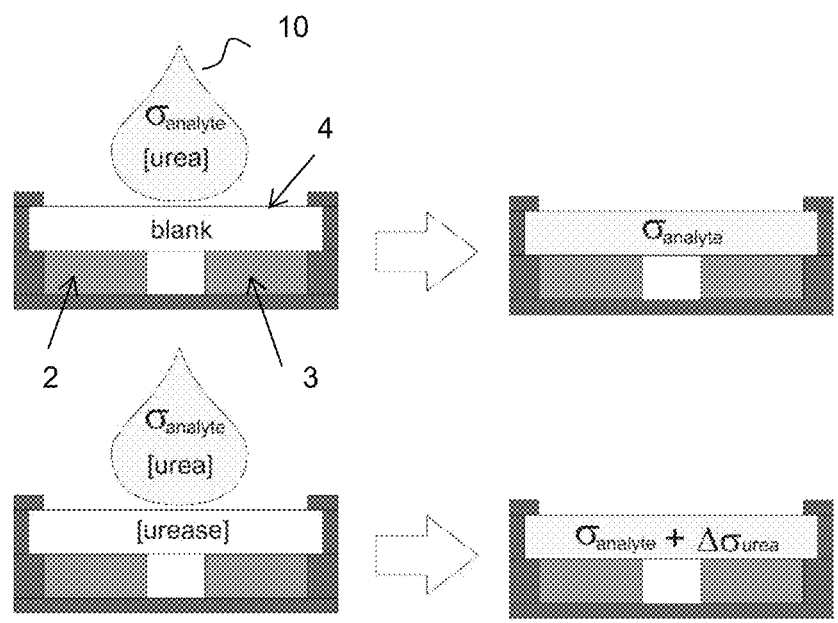
FIG. 6A is a schematic representation of the addition of catalysts in the proposed device according to an embodiment of the present invention.
Figure 6B:
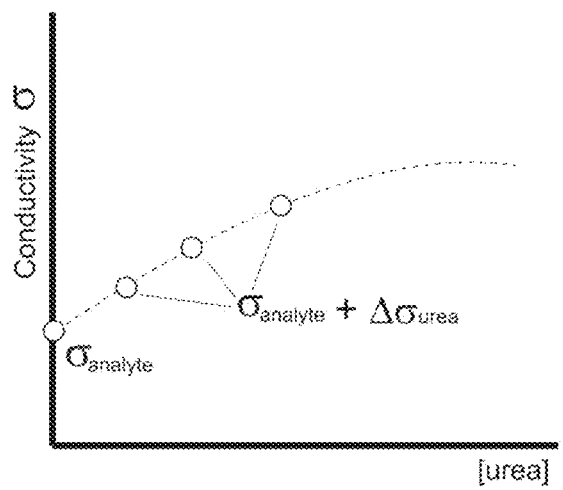
FIG. 6B shows a generic calibration curve.

A particular example of the fifth embodiment is illustrated in FIG. 6. Urease enzyme is immobilized inside the hydrophilic and/or porous material 4 (e.g. in the form of a membrane) of a battery 1. A fluid sample 10 containing urea is used to activate the battery 1. In presence of urea, the urease enzyme will decompose the molecule into two different ions. The reaction taking place will be:

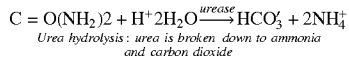

$$C = O(NH_2)2 + H^+ 2H_2O \xrightarrow{urease} HCO_3^- + 2NH_4^+$$
Urea hydrolysis: urea is broken down to ammonia and carbon dioxide The generation of new charged species modifies the electrolytic conductivity of the fluid sample 10. Change in electrolytic conductivity will depend on the enzymatic activity and the urea concentration. Comparing the performance of two identical batteries 1, one without urease and the other with urease stored in the membrane 4 would allow sensing the change in conductivity purely due to the urease activity (see FIG. 6a for a schematic representation of the concept). Using different batteries and comparing their performance to the battery without enzyme, the change in electrolytic conductivity vs urea concentration in the fluid sample 10 could be calibrated. FIG. 6b shows a generic calibration curve. This idea could be extended to other kind of catalysts and enzymes in order to perform the detection of different analytes of interest.

In a sixth embodiment, the battery 1 is connected to a potentiostat that measures Voltage-Current characteristics of the battery 1 and derives the electrolytic conductivity value from them. The potentiostat can be powered with the power generated by the battery 1 or by an external power source.

In an embodiment, the proposed device is based on a paper battery. This battery 1 of this embodiment comprises two coplanar electrodes 2, 3 of dimensions 2.5×5 mm² each made of magnesium (anode) and silver chloride (cathode) mounted on top of a pressure sensitive adhesive layer and separated 1.5 mm from each other. The electrodes 2, 3—which in this case are placed side by side—and the area between them are covered by two layers of glass fiber-based paper with a total thickness of 0.5 mm and an area of 60 mm². The paper 4 allows holding a fluid volume of 15 µL. When the fluid sample 10 to be characterized is deposited on the paper 4, it is absorbed by capillarity until the paper 4 is completely saturated. As said before, this fluid sample 10 plays the role of the battery electrolyte and its electrolytic conductivity has an important effect on battery performance.

Battery operation starts once the paper 4 is completely filled with the fluid sample 10. The basic electrochemistry of this battery 1 has been used in the past in the so-called seawater-activated batteries. The reactions involved in the paper battery are as follows:

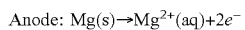

Anode: $Mg(s) \rightarrow Mg^{2+}(aq)+2e^-$

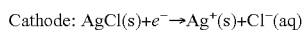

Cathode: $AgCl(s)+e^- \rightarrow Ag^+(s)+Cl^-(aq)$

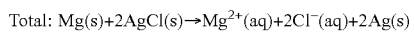

Total: $Mg(s)+2AgCl(s) \rightarrow Mg^{2+}(aq)+2Cl^-(aq)+2Ag(s)$

Figure 2:
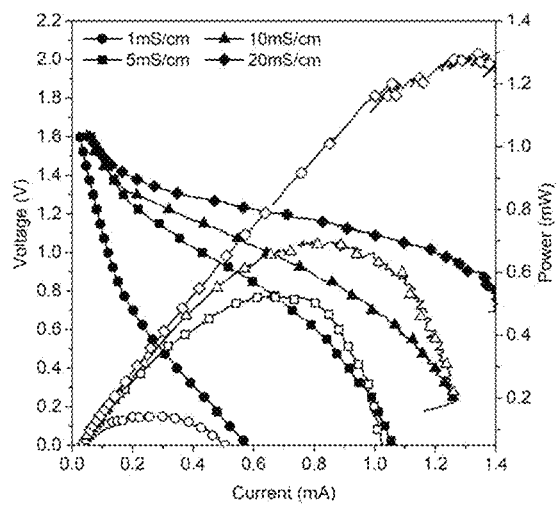
FIG. 2 shows the I-V curves obtained for different NaCl concentrations of fluid taking into account the teachings of present invention.

The standard voltage for this cell is 2.59 V. However, the open-circuit voltage (Voc) in neutral media is set around 1.5-1.7 V. This deviation from the theoretical voltage is due to the high polarization voltage caused by the building-up of an oxide layer on the magnesium film. In order to test the impact of the electrolytic conductivity on the performance of the battery 1, I-V curves of the battery 1 were recorded after its paper core was filled with water-based solutions containing different Sodium chloride NaCl concentrations that set liquid electrolytic conductivities to 1.0 mS·cm$^{-1}$, 5 mS·cm$^{-1}$, 10 mS·cm$^{-1}$ and 20 mS·cm$^{-1}$. FIG. 2 shows the obtained I-V curves. Power versus intensity has also been represented in this figure in order to visualize the impact of the fluid electrolytic conductivity on the power generated by the battery 1.

The polarization curves show that, as expected, there is a visible influence of electrolytic conductivity of the fluid sample 10 used as electrolyte on the resistivity of the cell. This can be clearly observed in the ohmic region of the curves (currents above 0.2 mA). At low current values (near OCP voltage), large activation losses related to the pre-existing passivating layer of magnesium oxide in the anode 2 can be observed. The effect of this passivating layer becomes less prominent at increasing electrolytic conductivities, mainly due to the fact that the presence of chloride ions increases the rate of the anodic dissolution kinetics. At higher current densities, the battery 1 shows concentration losses due to a limitation in the Silver chloride AgCl reduction reaction rate at the cathode 3.

In an embodiment, the proposed device is a self-powered skin patch for the diagnostic screening of cystic fibrosis (CF) disease in sweat. Measurement of sweat electrolytic conductivity has proved to be a reliable method to discriminate between CF and non-CF subjects. In this application, the electrolytic conductivity is measured in millimolar of NaCl equivalents, meaning that the electrolytic conductivity value of the sweat is equal to the electrolytic conductivity of a NaCl solution with this particular molarity. It is accepted that values above 60 mM of equivalent NaCl are considered abnormal. Currently, the sweat test is performed by taking the fluid sample 10 from the arm of the patient using a dedicated plastic device that contains a capillary in contact with the skin. Once enough fluid sample 10 is collected by capillarity (i.e. the capillary is full), the sweat has to be transferred to a syringe and then introduced into the benchtop measurement equipment that measures its electrolytic conductivity with an AC method. The patch preferably has been conceived to be placed on the forearm of the patient and yields a "positive" result in case of an abnormal electrolytic conductivity level of sweat. The patch remains quiescent until the sweat (i.e. the fluid sample 10) is absorbed by the paper areas in contact with the skin. The collected sweat performs as the battery electrolyte. The battery 1 will yield an electrical power that is proportional to the electrolytic conductivity of the sweat sample 10, so that this electrolytic conductivity can be inferred in a precise way. The linearity range of electrical power and electrolytic conductivity of the fluid 10 depends on the particular geometry and materials used to fabricate the battery 1.

Figure 7:
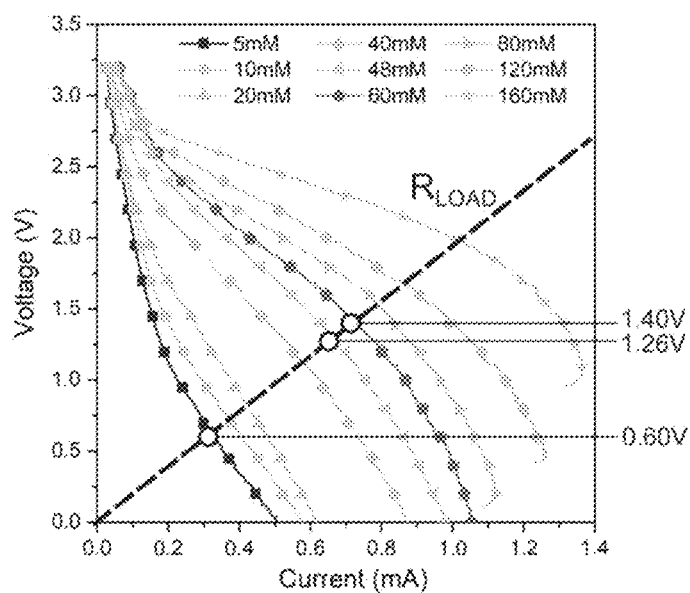
FIGS. 7 to 9 illustrate different results obtained by the proposed device acting as a self-powered skin patch for diagnostic screening of cystic fibrosis according to an embodiment of the present invention.

The visualization of test results is done with two electrochromic displays 19 (see FIG. 12 for an example or FIG. 14, 15 or 16), one control display to assess that the patch is working correctly and one test display that shows the word "Positive" when the sweat electrolytic conductivity is above the concentration of 60 mM equivalent NaCl, which is considered the threshold value for CF determination. The displays used here turn on for applied voltages as low as 0.6 V and currents of 700 nm. Therefore, in order to ensure that the control display turns on at the lowest electrolytic conductivity value of 5 mM, the patch makes use of two sensing batteries connected in series. FIG. 7 shows the polarization curves obtained with the battery stack at different NaCl concentrations at room temperature.

Figure 8:
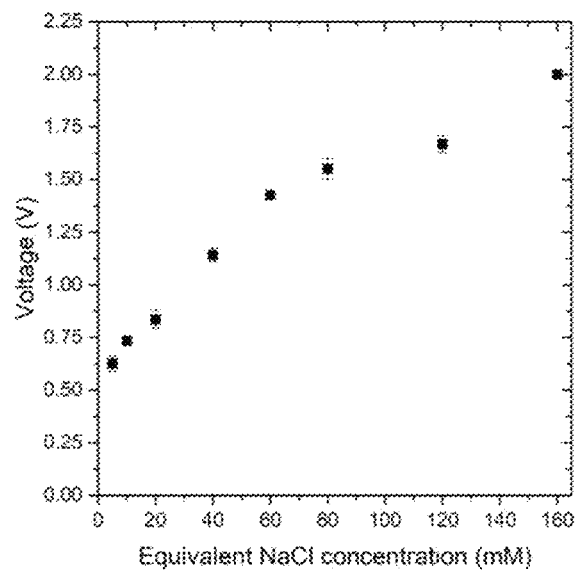
Figure 9:
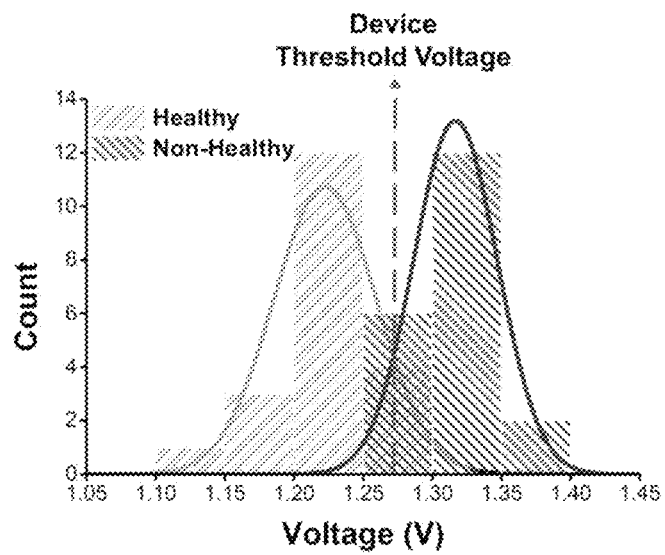

The battery 1 is operated by connecting a fixed resistor value $R_{LOAD}$. The value of $R_{LOAD}$ has been fixed to 2 kΩ, a value determined by setting the minimum resistivity value that yields a voltage of 0.6V when the battery 1 is operated with 5 mM NaCl (FIG. 7 shows the intersection between the polarization curves of the battery 1 and the selected $R_{LOAD}$). As it is shown in FIG. 8, the battery output voltage is proportional to the concentration of NaCl present in the electrolyte up to 60 mM, although it continues to respond to electrolytic conductivity changes up to the concentration range required in the application. To characterize the performance of the proposed device for screening purposes, the User protocol for Evaluation of Qualitative Test Performance (EP12-P) dictated by the Clinical and Laboratory Standards Institute that advices studying statistically the sensor performance at the threshold value (60 mM) and at a cut-off value corresponding to the −20% of the threshold value (48 mM) can be followed. FIG. 7 highlights the polarization curves at both concentrations and the voltages generated by the battery stack under the selected $R_{LOAD}$. According to the recommended procedures of the protocol, 40 different batteries at both threshold and cut-off values were measured, their polarization curves were recorded and a Gaussian distribution of the battery voltage values was obtained. FIG. 9 shows the obtained results. As we wanted the proposed device to yield a 95% of positive results at 60 mM, the threshold voltage of the battery stack was set to 1.26V.

Figure 10:
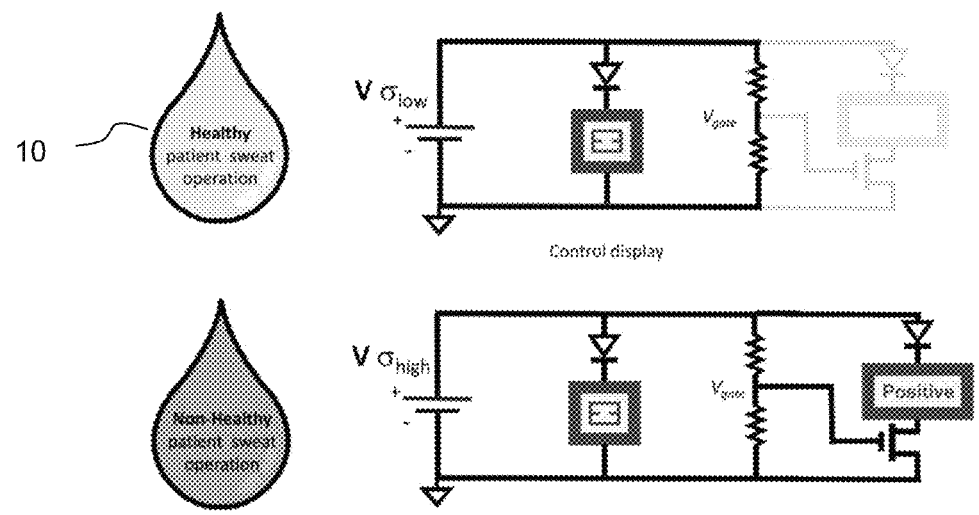
FIG. 10 shows the electrical circuit schematics used in the embodiment of FIGS. 7 to 9.
Figure 11:
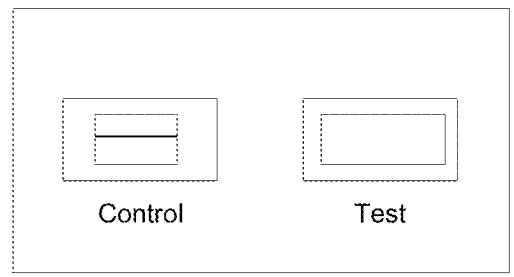
FIG. 11 schematically shows the front side of the patch yielding a negative result for CF screening (top) and a positive result (bottom).
Figure 11:
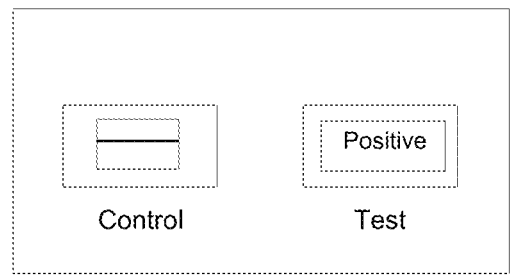
Figure 12:
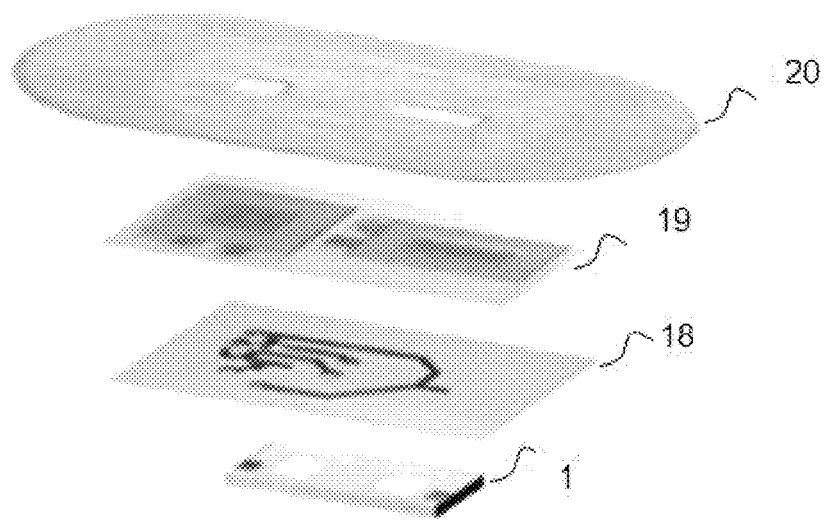
FIG. 12 schematically illustrates the different layers and components used to obtain the self-powered screening patch.

In order to discriminate the voltage provided by the battery 1 below and above the threshold voltage value, an instrument (or electronic circuit) with a minimum number of components that had to be operated with the power provided by the battery sensor, without any assistance of external power sources was designed. FIG. 10 shows a schematic of the circuit. The circuit uses a MOSFET transistor to discriminate the voltage generated by the battery 1 under $R_{LOAD}$, a resistor value that is split between resistors $R_1$ and $R_2$. $R_2$ value is calibrated so when the voltage provided by battery 1 is below the threshold value, $V_2<V_{gate}$ and no current $i_{positive}$ flows towards the positive display. Contrarily, when the battery 1 yields a value over the threshold, $V_2$ is larger than $V_{gate}$, which allows enough current to flow towards the positive display. In addition to these few components, two diodes have been added in series to the displays in order to prevent their discharge once the battery ceases to operate. FIG. 12 shows an exploded view of all the different layers and components that have been used to obtain the self-powered screening patch, i.e. a skin-friendly adhesive 20, the electrochromic displays 19, a hybrid printed electronic circuit 18 and the paper-based battery 1.

Figure 13:
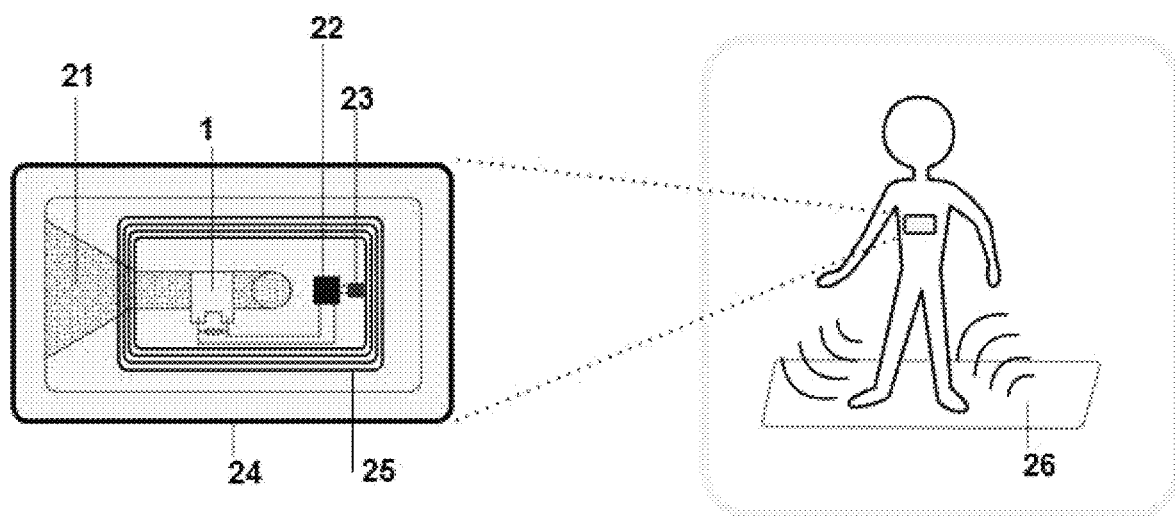
FIG. 13 illustrates an embodiment of the proposed device acting as a self-powered sensor for sweat monitoring.

With reference now to FIG. 13, therein it is illustrated another embodiment of the proposed device, in this case in the form of a self-powered skin patch for sweat monitoring to assess the hydration state of athletes in races or other individuals under physical stress for periods up to 3 or 4 hours. Body thermoregulatory sweating permits the dissipation of body heat and regulates the body core temperature. By sweating, heat is transferred from the body to water on the surface of skin. During high intensity activities, sweat output exceeds the fluid intake which can lead to not only to a body water deficit, also a shortfall of body electrolytes, manly sodium and chloride. The proposed device aims to continuous monitoring sweat electrolytic conductivity since the amount of fluid 10 and its ionic composition can be directly related with the hydration state of an athlete. The device is attached to the athlete's skin and when the sweat production starts, it is collected, its electrolytic conductivity measured and the value recorded in a memory to afterwards send it to an external wireless system that receives the signal emitted by the self-powered skin patch. The self-powered skin patch comprises a paper-based battery 1 whose power output depends directly on the electrolytic conductivity of sweat (i.e. the fluid sample 10), a porous microfluidic structure (or channel) 21 that directs the sweat flow that is absorbed from the skin towards the battery porous core in a continuous manner, a skin-friendly adhesive 24 that allows to fix the device to the skin, and an instrument connected to the battery 1, in this case including a microprocessor 22 for signal monitoring and recording, an RFID chip 23 and antenna 25 to send the signal to an external device such and RFID reader. Alternatively, the information recorded in the microprocessor 22 can be retrieved by means of an external RFID reader (e.g. floor band 26) or a reader device with NFC capabilities.

Figure 14A:
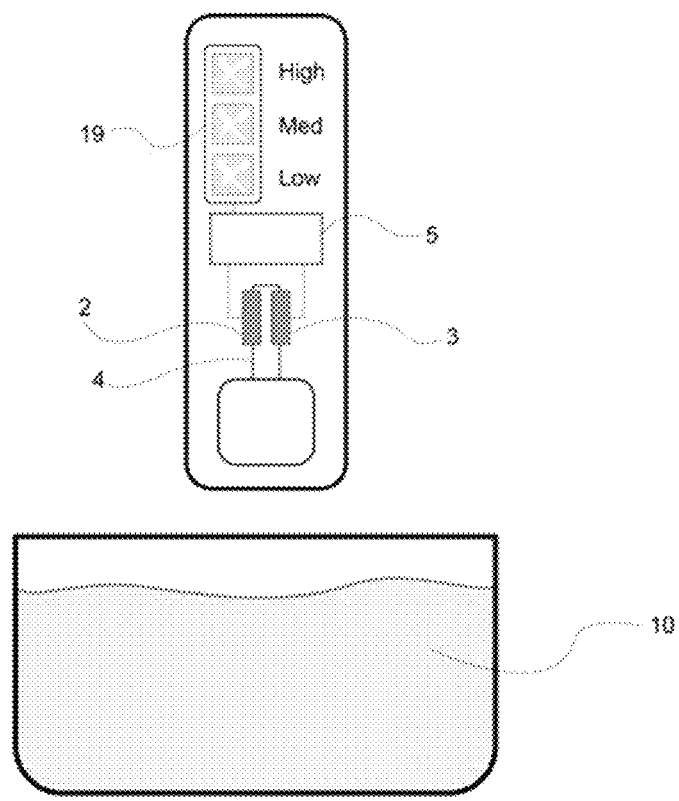
FIGS. 14A and 14B illustrate another embodiment of the proposed device acting as a self-powered sensor for measuring water ionic conductivity.
Figure 14B:
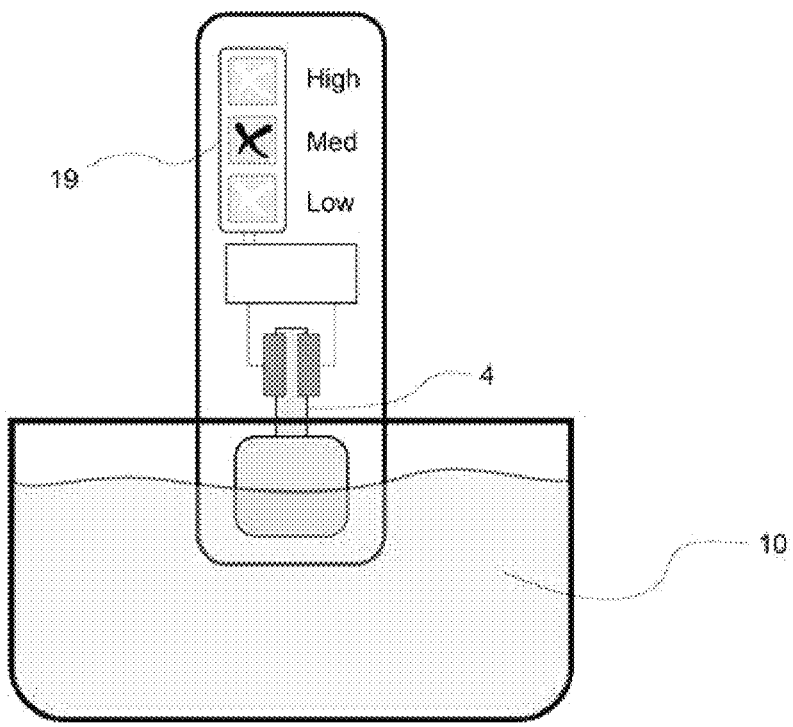

FIG. 14 illustrates another embodiment of the proposed device, in this case in the form of a self-powered device for measuring water ionic conductivity. Ionic conductivity—also called salinity—of water for irrigation has an important role in agriculture, as the amount of tolerated salt content in water depends on the crop to be farmed. This parameter indicates the amount of salts present in water due to the dissolution of minerals from rocks or by the contribution of biochemical cycles associated with the presence of biological activity (plants or animals). The device of this embodiment comprises one or multiple units connected in series of paper-based battery 1 placed on a rigid substrate. The battery 1 is connected to one or more microfluidic paper-based channels that end up with a sample collection pad, where the water 10 to be analysed in poured. Alternatively, the collection zone can be immerged into the water 10 to be analysed and then be driven towards the battery core by capillarity. The battery or the battery stack is connected to a resistive load (i.e. the instrument 5) that sets the battery 1 at a particular operation point (voltage and current) depending on the electrolytic conductivity value. Voltage or current levels are discriminated by a set of electronic element (transistors, resistive switches, etc.) that are enabled when voltage or current exceeds a predetermined threshold value. Besides, a set of displays 19 are connected to the instrument 5, where each display can be switched on when the instrument 5 is enabled. In this way, the result of the electrolytic conductivity value is discriminated within different levels that can be optically visualized in the displays 19.

Figure 15A:
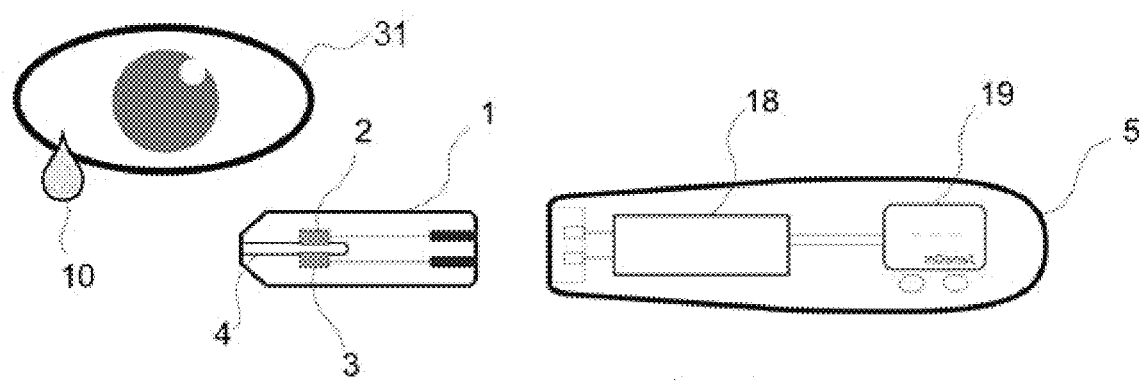
FIGS. 15A and 15B illustrate another embodiment of the proposed device in the form of a smart strip for tear conductivity measurement.
Figure 15B:
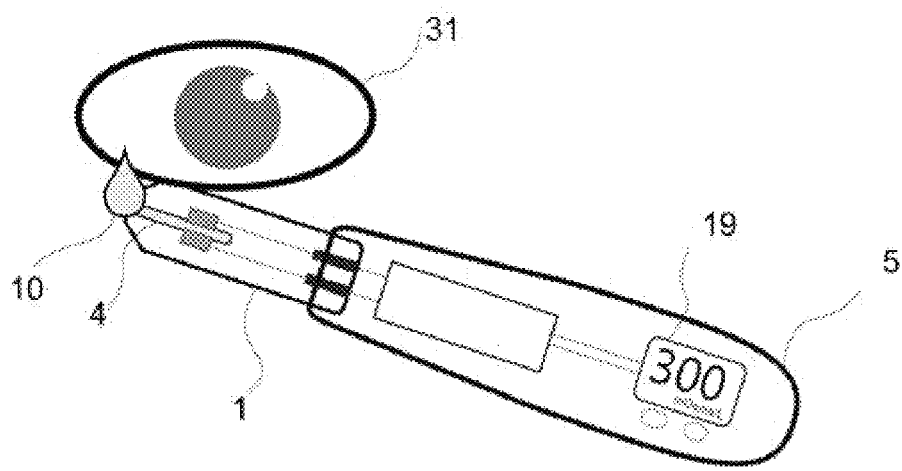
Figure 16A:
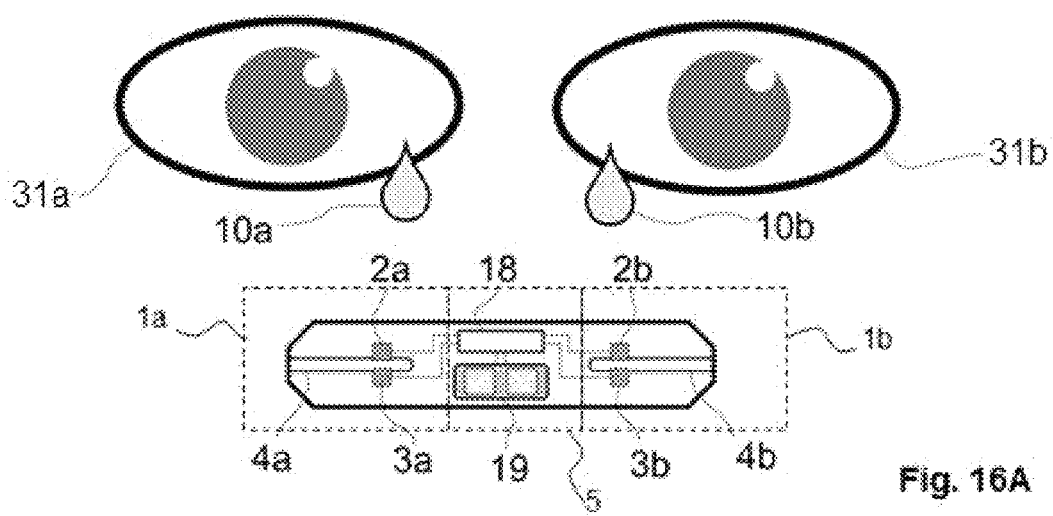
FIGS. 16A, 16B, 16C and 16D illustrate another embodiment in which two batteries are integrated in a smart strip for tear conductivity measurement.
Figure 16B:
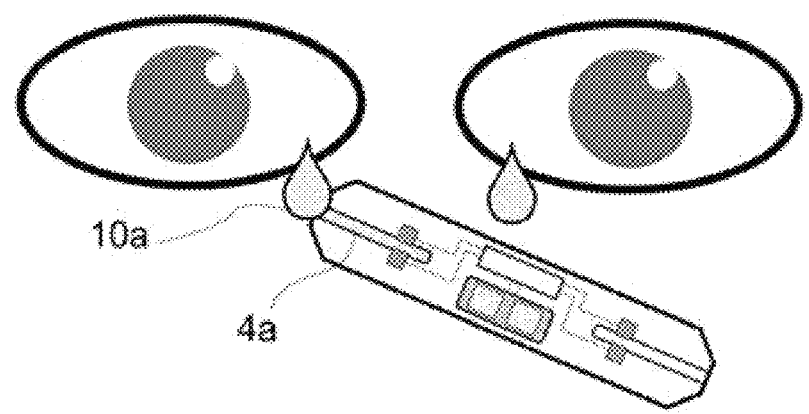
Figure 16C:
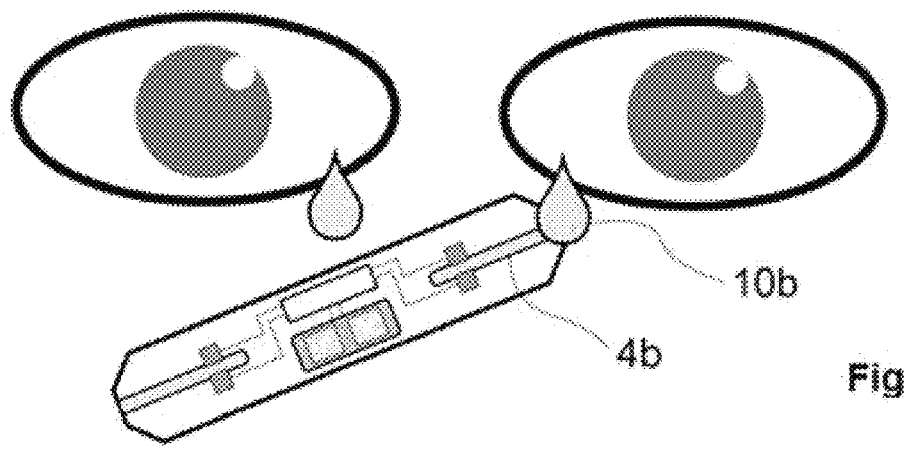
Figure 16D:
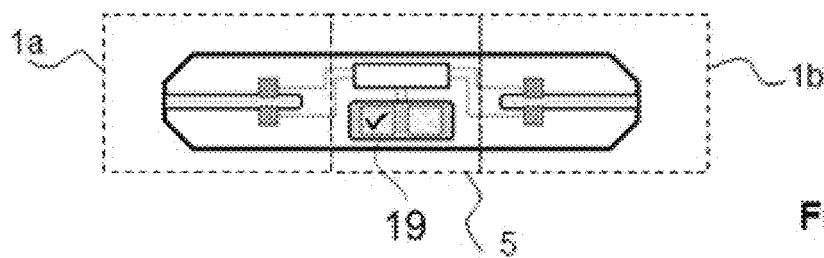

With reference to FIG. 15, therein it is illustrated another embodiment of the proposed device, in this case in the form of a smart strip for tear conductivity measurement. Tear osmolarity is a relevant parameter to diagnose and monitor the dry eye disease. Osmolality is defined as the measure of solute concentration per liter. Tear osmolarity depends on the rate of tear secretion and evaporation from the eye. As tear secretion decreases in the dry eye disease, osmolarity and hence the conductivity of tears increases because the volume of isotonic tears is inadequate to overcome the loss of fluid mainly by evaporation. The device of this embodiment (see FIG. 15A) consists of an empty capillary or a paper-based microfluidic channel 4 that collects a tear sample 10 from the eye 31 and directs it towards a paper-based battery 1, which is activated upon the arrival of the tear sample 10. The battery 1 is connectable (see FIG. 15B) to an instrument 5 that includes an electronic circuit 18 that sets the battery 1 at an operation point that depends on tear electrolytic conductivity and therefore allows discerning the tear electrolytic conductivity value (or range). The electronic circuit 18 contains a microprocessor (not shown) to process the signal from the battery 1. A display element 19 communicates the result to a user.

In FIG. 16 another embodiment is showed in which two batteries 1a and 1b are integrated in a smart strip for tear electrolytic conductivity measurement. The device of this embodiment, see FIG. 16A, consists of two empty capillary or a paper-based microfluidic channels 4a and 4b that collect a tear sample 10 from each eye 31a, 31b (FIGS. 16B and 16C) and directs it towards the two batteries 1a, 1b, that are activated upon the arrival of the tear samples 10a and 10b to the electrodes 2a-3a and 2b-3b. Both batteries 1a, 1b are connected to an instrument 5 that includes an electronic circuit 18 that sets the batteries 1a, 1b at an operation point that depends on tear electrolytic conductivity and processes the tear electrolytic conductivity values (or ranges) from the two tear samples 10a and 10b. A display element 19 communicates the result to a user (FIG. 16D).

The scope of the present invention is defined in the following set of claims.

What is claimed is:

1. A method for sensing an electrolytic conductivity of a fluid, the method comprising the steps of:
   providing a battery comprising an oxidizing electrode and a reducing electrode that are separated at a distance and connected by one of a hydrophilic material, a porous material, a combination of the hydrophilic material and the porous material, or an empty receptacle, thereby providing a microfluidic cavity,
   a battery performance being sensitive to a presence of analytes with ionic charge that determine an electrolytic conductivity of the fluid to be sensed, the fluid acting as a battery electrolyte and not as fuel,
   the oxidizing electrode comprising a first material that undergoes oxidation and the reducing electrode comprising a second material that undergoes reduction, the oxidizing electrode and the reducing electrode being indirectly in contact via the fluid,
   an internal resistance of the battery depending on the electrolytic conductivity of the fluid, and
   the battery being activated upon an addition of the fluid to the microfluidic cavity;
   providing, by the battery, electrical energy while the fluid impregnates by capillarity the microfluidic cavity; and
   connecting at least one instrument to the battery, the instrument being designed such that its equivalent impedance makes the battery work at a specific operating point allowing determining or discriminating among values of the electrolytic conductivity of the fluid via a Direct Current (DC) mode method,
   wherein the instrument further quantifies the electrolytic conductivity of the fluid from the electrical energy provided by the battery,
   wherein the electrolytic conductivity of the fluid is inferred from the battery performance.

2. The method of claim 1, further comprising
adjusting a battery response by:
   adding one or more chemical species to the fluid before its addition to the battery, or to the hydrophilic material, to the porous material, to the combination of the hydrophilic material and the porous material, or to the empty receptacle in order for an enzyme or an inorganic catalyst to react with a particular substance present in the fluid, thereby causing a change in an electrolytic conductivity range, or adding salts before or after the fluid is added to the battery to increase the electrolytic conductivity of the fluid to achieve a selected sensitivity range; or adding the enzyme, bacteria, or the inorganic catalyst to the fluid before its addition to the battery, or to the hydrophilic material, to the porous material, to the combination of the hydrophilic material and the porous material, or to the empty receptacle in order that the enzyme or the inorganic catalyst reacting with a particular substance present in the fluid causes a change in the electrolytic conductivity;

adding a given amount of titrant to the hydrophilic material, or to the porous material, or to the combination of the hydrophilic material and the porous material, or to the empty receptacle to determine a specific ion or molecule concentration of the fluid; or adding an ion-selective membrane.

3. A device for sensing an electrolytic conductivity of a fluid, the device comprising:

a battery that is fluid-activated, the battery comprising an oxidizing electrode and a reducing electrode that are separated at a distance and connected by a hydrophilic material, by a porous material, by a combination of the hydrophilic material and the porous material, or by an empty receptacle, thereby providing a microfluidic cavity for a fluid, the battery being configured to provide electrical energy while the fluid impregnates by capillarity the microfluidic cavity; and at least one instrument connected to the battery;

a battery performance being sensitive to a presence of analytes with ionic charge that determine an electrolytic conductivity of the fluid, the fluid acting as a battery electrolyte and not as a fuel;

the oxidizing electrode comprising a first material that undergoes oxidation and the reducing electrode comprising a second material that undergoes reduction, the oxidizing electrode and the reducing electrode being indirectly in contact via the fluid, an internal resistance of the battery depending on the electrolytic conductivity of the fluid; and the instrument being designed such that its equivalent impedance is configured to make the battery work at a specific operating point that allows determining or discriminating among values of the electrolytic conductivity of the fluid via a Direct Current (DC) mode method, wherein the instrument is further configured for quantifying the electrolytic conductivity of the fluid, wherein the electrolytic conductivity of the fluid is inferred from the battery performance.

4. The device of claim 3, wherein the battery is a paper-based battery.

5. The device of claim 3, wherein the fluid is a water-based fluid, juice or milk, an ink or a biological fluid including saliva, urine, blood, sperm, plasma, serum, mucus, tears, feces, or sweat, or wherein the fluid comprises a non-aqueous liquid including an ionic liquid.

6. The device of claim 3, wherein the instrument further comprises at least one electronic module configured to perform power management functions, signal control, and processing functions of an electrical signal captured from the battery or telecommunication functions.

7. The device of claim 6, wherein the instrument further comprises at least one of: a memory to store a result-of a quantification, a communication unit to transmit said result to an external device, an indicator comprising an audible and/or a visual indicator including a buzzer, a screen, a display or an alarm to indicate the result.

8. The device of claim 3, wherein the instrument is configured to be solely powered by an amount of electrical energy provided by the battery or is configured to be solely powered by an external power source or by an amount of electrical energy provided by the battery and amount of energy from an external power source.

9. The device of claim 3, wherein the oxidizing electrode and the reducing electrode of the battery are arranged side by side, face to face or in an interdigitated configuration.

10. The device of claim 3, further comprising several batteries connected in series to increase an output voltage or in parallel to increase an output current.

11. The device of claim 3, wherein the hydrophilic material, the porous material, the combination of the hydrophilic material and the porous material, or the empty receptacle comprises an enzyme, bacteria or inorganic catalyst configured to react with a particular substance present in the fluid that causes a change in the electrolytic conductivity of the fluid.

12. The device of claim 3, further comprising an ion selective membrane.

* * * * *